(12) United States Patent
Luo

(10) Patent No.: US 11,306,524 B2
(45) Date of Patent: Apr. 19, 2022

(54) SLIDING DOOR DEVICES AND ELECTRONICS

(71) Applicant: Lenovo (Beijing) Co., Ltd., Beijing (CN)

(72) Inventor: Yadi Luo, Beijing (CN)

(73) Assignee: LENOVO (BEIJING) CO., LTD., Beijing (CN)

( * ) Notice: Subject to any disclaimer, the term of this patent is extended or adjusted under 35 U.S.C. 154(b) by 97 days.

(21) Appl. No.: 16/729,234

(22) Filed: Dec. 27, 2019

(65) Prior Publication Data
US 2020/0208452 A1 Jul. 2, 2020

(30) Foreign Application Priority Data
Dec. 29, 2018 (CN) .......................... 201811647592.0

(51) Int. Cl.
| | |
|---|---|
| *G06F 1/18* | (2006.01) |
| *E05D 15/08* | (2006.01) |
| *E05F 7/00* | (2006.01) |
| *H05K 5/00* | (2006.01) |
| *E05D 15/06* | (2006.01) |

(52) U.S. Cl.
CPC .............. *E05D 15/08* (2013.01); *E05F 7/005* (2013.01); *G06F 1/181* (2013.01); *H05K 5/00* (2013.01); *E05D 15/0665* (2013.01); *E05Y 2201/11* (2013.01); *E05Y 2201/244* (2013.01); *E05Y 2600/31* (2013.01); *E05Y 2900/606* (2013.01)

(58) Field of Classification Search
CPC ........... E05D 15/08; G06F 1/181; H05K 5/00; H05K 5/0239; H05K 5/03
See application file for complete search history.

(56) References Cited

U.S. PATENT DOCUMENTS

| | | | | |
|---|---|---|---|---|
| 4,880,712 A | * | 11/1989 | Gordecki | ............... H04B 1/088 429/97 |
| 6,510,960 B1 | * | 1/2003 | Christopherson | .... H01R 13/447 220/345.3 |
| 6,854,328 B2 | * | 2/2005 | Badiali | .................. H05K 5/061 248/27.1 |
| 7,307,846 B2 | * | 12/2007 | Du | ........................ G06F 1/1616 361/727 |

(Continued)

FOREIGN PATENT DOCUMENTS

| | | |
|---|---|---|
| CN | 201185517 Y | 1/2009 |
| CN | 102036524 A | 4/2011 |

(Continued)

*Primary Examiner* — Abhishek M Rathod
*Assistant Examiner* — Keith DePew
(74) *Attorney, Agent, or Firm* — Anova Law Group, PLLC

(57) ABSTRACT

Embodiments of the present disclosure provide a sliding door unit and an electronic device thereof. The sliding door unit includes a sliding door, setting on a base through a sliding component, and configured to slide relative to the base when receiving an external force; a first movement mechanism group placed at a first end of the sliding door; and a second movement mechanism group placed at a second end of the sliding door, and the first and second ends being two opposite ends. The first movement mechanism group and the second movement mechanism group move at a matching pace relative to the sliding door on the base when the sliding door is moved by the external force.

16 Claims, 5 Drawing Sheets

(56) References Cited

U.S. PATENT DOCUMENTS

| | | | | |
|---|---|---|---|---|
| 8,050,727 | B2* | 11/2011 | Li | G06F 1/1624 |
| | | | | 455/575.4 |
| 8,613,550 | B2* | 12/2013 | Mai | G06F 1/1624 |
| | | | | 384/26 |
| 8,616,769 | B2* | 12/2013 | Mai | G06F 1/1681 |
| | | | | 384/26 |
| 8,721,354 | B2* | 5/2014 | Liao | H01R 13/4534 |
| | | | | 439/131 |
| 8,792,228 | B2* | 7/2014 | Chen | H05K 5/0239 |
| | | | | 361/679.02 |
| 9,451,717 | B2* | 9/2016 | Proctor | G11B 17/0405 |
| 9,451,718 | B2* | 9/2016 | Oneufer | H05K 5/0239 |
| 9,901,003 | B2* | 2/2018 | Tehranchi | H05K 5/0239 |
| 10,126,788 | B2* | 11/2018 | Dai | H05K 7/1487 |
| 2012/0237145 | A1* | 9/2012 | Mai | G06F 1/1624 |
| | | | | 384/26 |
| 2013/0021725 | A1* | 1/2013 | Huang | G06F 1/1656 |
| | | | | 361/679.01 |
| 2013/0058047 | A1* | 3/2013 | Chen | H05K 5/0239 |
| | | | | 361/724 |
| 2015/0250069 | A1* | 9/2015 | Proctor | H05K 5/0239 |
| | | | | 361/724 |
| 2015/0382492 | A1* | 12/2015 | Oneufer | H05K 5/0017 |
| | | | | 312/295 |
| 2018/0275726 | A1* | 9/2018 | Dai | H05K 7/1487 |

FOREIGN PATENT DOCUMENTS

| | | | |
|---|---|---|---|
| CN | 204242057 U | * | 4/2015 |
| CN | 204242057 U | | 4/2015 |
| CN | 104960913 A | | 10/2015 |

* cited by examiner

SLIDING DOOR DEVICES AND ELECTRONICS

CROSS-REFERENCES TO RELATED APPLICATION

This application claims priority to Chinese Patent Application No. 201811647592.0, entitled "Sliding Door Unit and Electronic Device," filed on Dec. 29, 2018, the entire content of the which is incorporated herein by reference.

FIELD OF TECHNOLOGY

The present disclosure generally relates to door body sliding technology and, more specifically, relates to a sliding door unit, and an electronic device thereof.

BACKGROUND

In order to improve user experience, the plastic front panel of a desktop computer chassis are often designed with long-span sliding doors, which can slide to block the outlets and ports of the front I/O interfaces, optical drives, etc.

When user moves the sliding door along its longitudinal direction to any position, such sliding movement of the entire sliding door should be smooth. However, the track mechanisms are often separately set on the two sides of sliding door, so that when the sliding door is pushed from a point far from its center, the pushing force is received on one side of the sliding door, which may lead to tilting and cause the sliding door to be stuck. This also leads to the entire sliding door failing to slide evenly.

BRIEF SUMMARY OF THE DISCLOSURE

To overcome the problems described above and other problems, the present disclosure provides a sliding door unit, and an electronic device including such sliding door unit.

One aspect of the present disclosure provides a sliding door unit and an electronic device thereof. The sliding door unit includes a sliding door, setting on a base through a sliding component, and configured to slide relative to the base when receiving an external force; a first movement mechanism group placed at a first end of the sliding door; and a second movement mechanism group placed at a second end of the sliding door, and the first and second ends being two opposite ends. The first movement mechanism group and the second movement mechanism group move at a matching pace relative to the sliding door on the base when the sliding door is moved by the external force.

Another aspect of the present disclosure provides an electronic device. The electronic device includes a sliding door unit in front of a chassis with one or more electrical ports, when a sliding door of the sliding door unit slides, the one more electrical ports of the electronic device are revealed. The sliding door unit includes a sliding door, setting on a base through a sliding component, and configured to slide relative to the base when receiving an external force; a first movement mechanism group placed at a first end of the sliding door; and a second movement mechanism group placed at a second end of the sliding door, and the first and second ends being two opposite ends. The first movement mechanism group and the second movement mechanism group move at a matching pace relative to the sliding door on the base when the sliding door is moved by the external force.

BRIEF DESCRIPTION OF THE DRAWINGS

For a more complete understanding of the present disclosure, and the advantages thereof, reference is now made to the following descriptions to be taken in conjunction with the accompanying drawings. The accompanying drawings in the following description show merely some embodiments of the present invention, and a person of ordinary skill in the art may still derive other drawings from these accompanying drawings without creative efforts.

DETAILED DESCRIPTION

The present disclosure provides a sliding door unit, which enables to the entire sliding door to slide smoothly and evenly.

In order to present the objectives, technical solution and advantage of the embodiments, the following sections provide a detailed and complete description of the embodiments and technical solution included in the present disclosure, with references to the attached figures of the present disclosure. Obviously, the embodiments described in the following sections are only a part of the embodiments of this invention, not all of them. Based on the illustrated embodiments in the application, for those of ordinary skill in the art, all other embodiments follow the spirit of the embodiments of the present disclosure, shall be within the scope of this application.

As shown in FIG. 1-7, the sliding door unit provided in the embodiments of the present disclosure includes a sliding door 2, a first movement mechanism group and a second movement mechanism group; the sliding door 2 is located on a base 1 through a sliding module. The sliding door 2 is able to slide relative to the base 1, under the external force meeting a condition. The first movement mechanism group is located at the first end of the sliding door 2. The second movement mechanism group is located at the second end of the sliding door 2. The first and second ends of the sliding door 2 are two opposite ends (according to the layout direction of the sliding door 2, they can be the left and right ends of the sliding door 2, and also the upper and lower ends, or the front and rear ends); the first movement mechanism group and the second movement mechanism group are able to move evenly relative to the sliding door 2, as a consequence, if the sliding door 2 is under the external force meeting a condition, the first movement mechanism group and the second movement mechanism group will move at the same time as above-mentioned, letting the first and second ends of the sliding door 2 move with a matching pace.

In some embodiments, the above-mentioned external force that satisfies a condition may refer to a force that can be decomposed along the sliding direction of the sliding door 2, and the magnitude of the force in the sliding direction is sufficiently strong to drive the sliding door to move relative to the base.

In some embodiments of the present disclosure, when a user needs to change the position of the sliding door, and an external force satisfying the condition is applied on the sliding door 2, under the external force, the first movement mechanism group and the second movement mechanism group move at the same pace relative to the sliding door 2, thereby, the first and second ends of the sliding door 2 will move with a matching pace on the base, therefore, the entire sliding door 2 is able to slide evenly, thus presenting the sliding door 2 from tilting and getting stuck.

Figure 6:
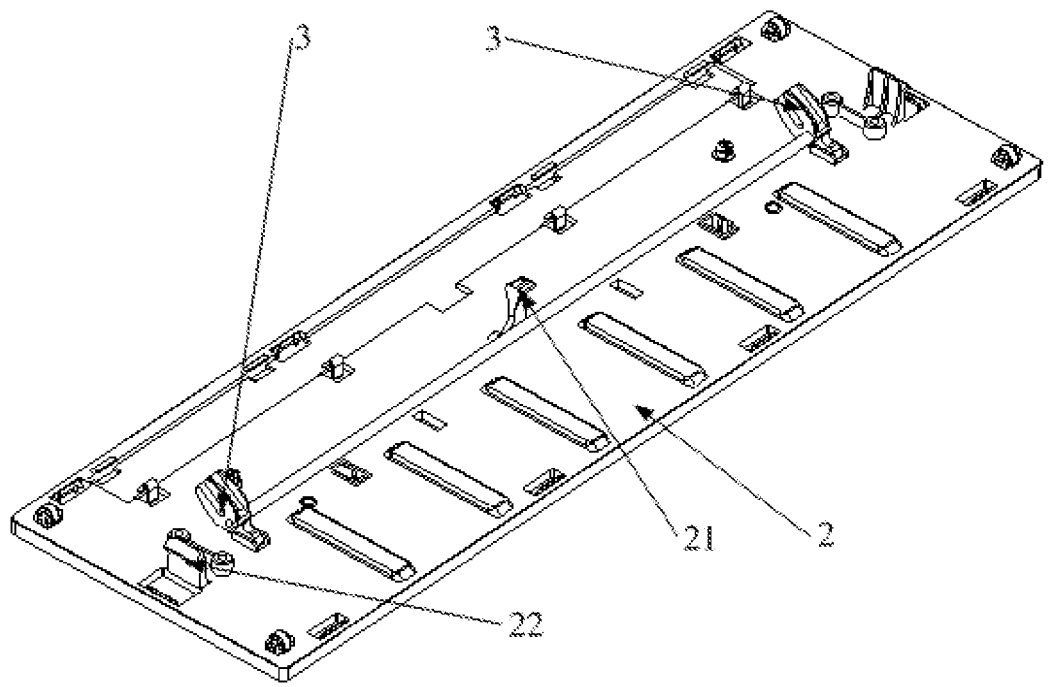
FIG. 6 illustrate the interior structure of a sliding door according to the embodiments of present disclosure.
Figure 7:
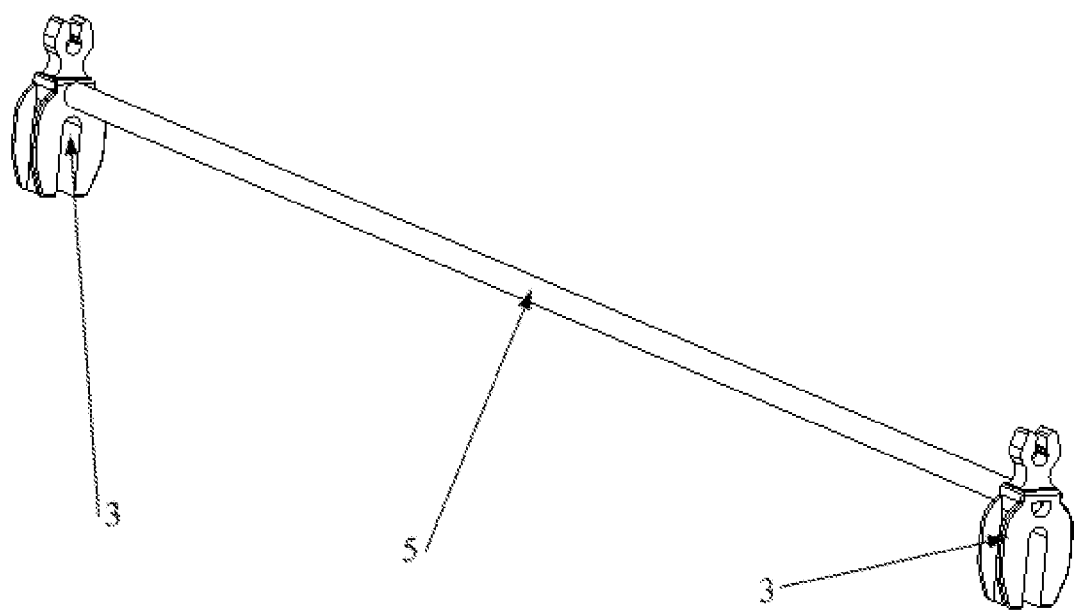
FIG. 7 illustrates a first movement mechanism group and a second movement mechanism group hinged to the connecting rod.

As shown in FIG. 6-7, in some embodiments, the first movement mechanism group and the second movement mechanism group are connected by a connecting rod 5. The connecting rod is 5 vertical to the sliding direction of the sliding door on the base. In this embodiment, a synchronous movement of the first movement mechanism group and the second movement mechanism group is achieved through the connecting rod 5, thereby driving the two ends of the sliding door 2 to slide evenly. One end of the connecting rod 5 is connected to the first movement mechanism group, and the other end is connected to the second movement mechanism group, which is a relatively simple structured. Alternatively, the connecting rod 5 can also be a long connecting plate, which does not affect the implementation of the present disclosure.

In embodiments of the present disclosure, the first movement mechanism group and the second movement mechanism group can be connected through other structures, such as a belt drive mechanism, a chain drive mechanism, a four-bar linkage mechanism, a wireless signal communication mechanism, a coil and magnet coupling structure, and so on, to obtain the same functionality of synchronized movement.

In some embodiments, the first movement mechanism group and the second movement mechanism group may have an identical structure, and the two movement mechanism groups can be located at the both ends of the sliding door 2, symmetrically. Consequently, these embodiments only need to manufacture one identical structure for the two movement mechanism groups, which is convenient for manufacturing and assembling. Obviously, the first movement mechanism group and the second movement mechanism group can also be different. For instance, one of them can be a slider-crank linkage mechanism, while the other can be a rack and pinion gears mechanism, as long as the two groups can move at the same pace, letting the first and second ends of the sliding door 2 move with a matching pace over the base 1.

In some embodiments, both movement mechanism group include a moving block 3, which is capable of moving in the plane perpendicular to the sliding door 2. One end of the movement block 3 hinges to the sliding door 2. The other end of the movement block 3 hinges to the base 1, and is capable to slide with the base 1.

In some embodiments, both movement mechanism group include a moving block 3, which is capable to move in the vertical plane to the sliding door 2. One end of the movement block 3 hinges to the sliding door 2, and the other end hinges to the base 1, and is capable to slide with the base 1 coordinately.

In the sliding process while the sliding door 2 is under the external force satisfying a condition, the moving block 3 in the movement mechanism group will transform the sliding motion of the sliding door 2 into a rotating motion of the moving block 3. Moreover, during the rotating motion, a sliding movement relative to the base 1 can avoid the consequential moving distance caused by the rotation motion that is not in the sliding direction of sliding door 2.

During the rotation of the moving block 3 in the first movement mechanism group of the sliding door 2 from the first end, its rotating motion is transmitted to the moving block 3 of the second movement mechanism group of the sliding door 2 at the second end through the connecting rod 5 evenly. Therefore, the two moving blocks on the two ends rotates evenly. This process uses a sliding movement relative to the base 1 to avoid the consequential moving distance caused by the rotation motion that is not in the sliding direction of sliding door 2. Meanwhile, the moving block 3 in the second movement mechanism group hinges to the sliding door 2, which transforms the sliding motion of the sliding door 2 into a rotating motion of the moving block 3, so that the entire sliding door is able to slide evenly in the same plane.

In this embodiment, the coordination of the moving block 3, sliding door 2 and the base 1, form a movement mechanism group, and the connecting rod 5 transmits the force, letting the first and second ends of the sliding door 2 move with a matching pace. In this embodiment, the movement mechanism group has a simple structure, requires a small number of components, is easy to assemble, and has a low cost. Further, a movement mechanism group can achieve a smooth sliding process with synchronized movements.

Understandably, the movement mechanism group can have a different structure. For instance, it can be a rack and pinion gears mechanism or a slider-crank linkage mechanism (while the sliding door 2 acts as a moving block structure), and so on, in order to realize the same effect, which transforms the sliding motion of sliding door 2 with another motion, and thereby drives the first end of the sliding door 2 and the second end of the sliding door 2 sliding on the base 1 with a matching pace. The present disclosure does not repeat the same or similar details.

Figure 1:
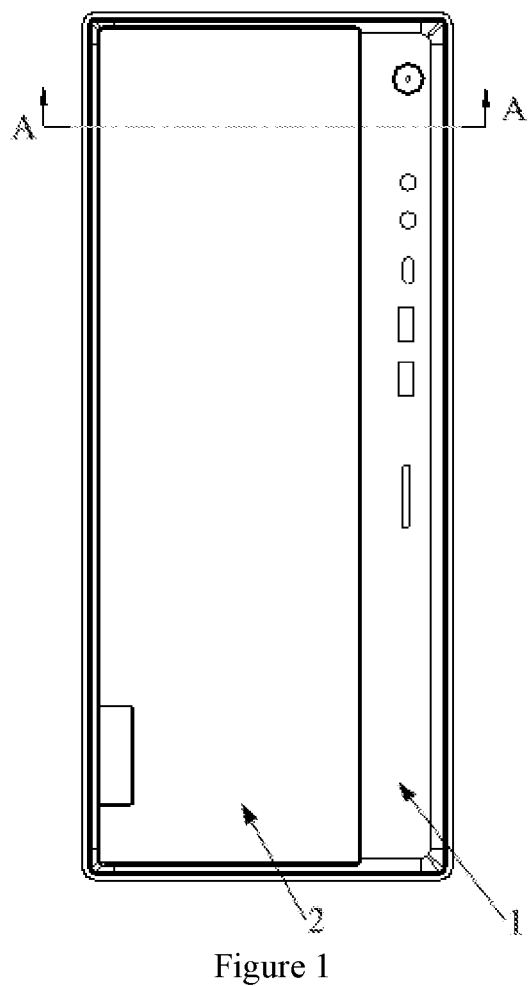
FIG. 1 illustrate a top view of an exemplary sliding door unit according to the embodiments of present disclosure.
Figure 2:
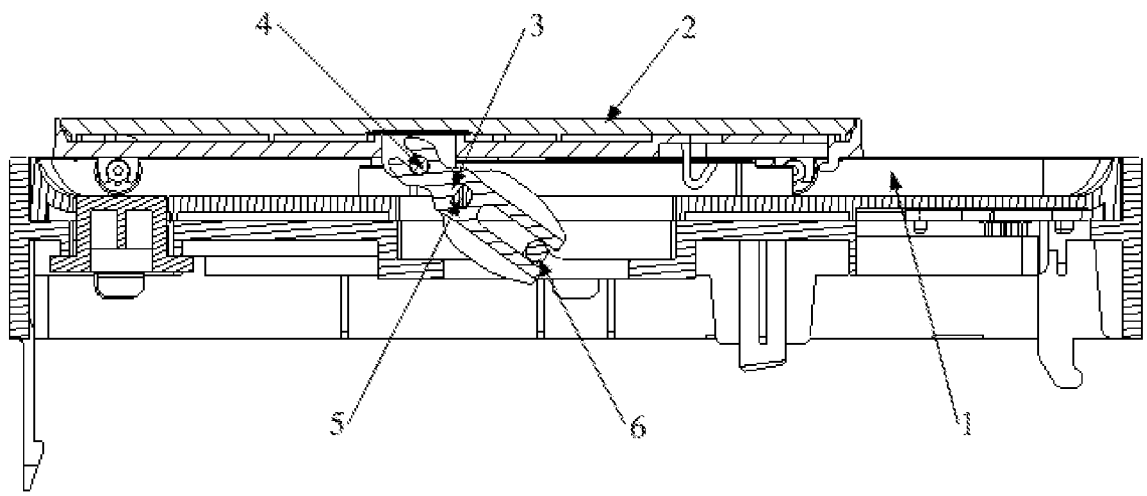
FIG. 2 illustrates a section view along the A-A line in FIG. 1.

As shown in FIG. 2, one end of the moving block 3 hinges to the sliding door 2 through a sliding shaft 4, and the other end has a U-shaped connecting part with an opening facing to the base 1. A slidable guiding shaft 6 is located inside the center groove of the U-shaped connection part in base 1.

On the one hand, during the sliding process of the sliding door 2, its sliding motion is transformed into a rotating motion of the moving block 3 rotating around the sliding shaft 4. During the rotating process of the moving block 3, its U-shaped connecting part rotates around the guiding shaft 6 on the base 1, and meanwhile the moving block 3 slides relative to the guiding shaft 6 on the base 1 as well, (more specifically, the guiding shaft 6 slides within the center groove of the U-shaped connecting part) to avoid the consequential moving distance caused by the rotation motion of the moving block 3 that is not in the sliding direction of sliding door 2. On the other hand, the connecting rod 5 transmits the rotating motion evenly, driving the moving block 3 rotating around the sliding shaft 4. The U-shaped connecting part rotates around the guiding shaft 6, and simultaneously sliding relative to the guiding shaft 6 on base 1. In the rotation process of the moving block 3, its rotating motion is transformed into sliding motion of the sliding door 2, as a result, driving the sliding door to slide evenly.

In embodiments of the present disclosure, the moving block 3 transforms the rotating motion of the moving block 3 and the sliding motion of the sliding door 2, form one to the other, using the sliding shaft 4, with a relatively simple structure. Alternatively, the moving block 3 can be hinged to the sliding door 2, and the U-shaped connecting part can be a rectangular connecting part with a kidney-shaped hole. In this present disclosure, a bump can be configured on the moving block 3, and a matching chute can be configured on the base 1, which may coordinate the rotating and sliding motions of the bump, in order to realize the same effect that the moving block 3 rotates relative to the base 1, and also slides relatively to base 1. The details will not be repeated herewith.

To implement an easy assembling process, the first end of the connecting rod 5 is fixedly connected to the center hole of the moving block 3 of the first moving mechanism group, and the second end of the connecting rod 5 is fixed to the center hole of the moving block 3 of the second moving mechanism group. Specifically, the center hole of the moving block 3 may be a semi-circular hole, and the first and the second end of the connecting rod 5 may be fixedly connected to the semi-circular hole through a semi-circular rod segment, which prevents connecting rod 5 from rotating during the force transmission. This improves reliability of the operations. In some embodiments, the above-mentioned connecting rod 5 can also be fixed on the moving block with a screw element.

Figure 5:
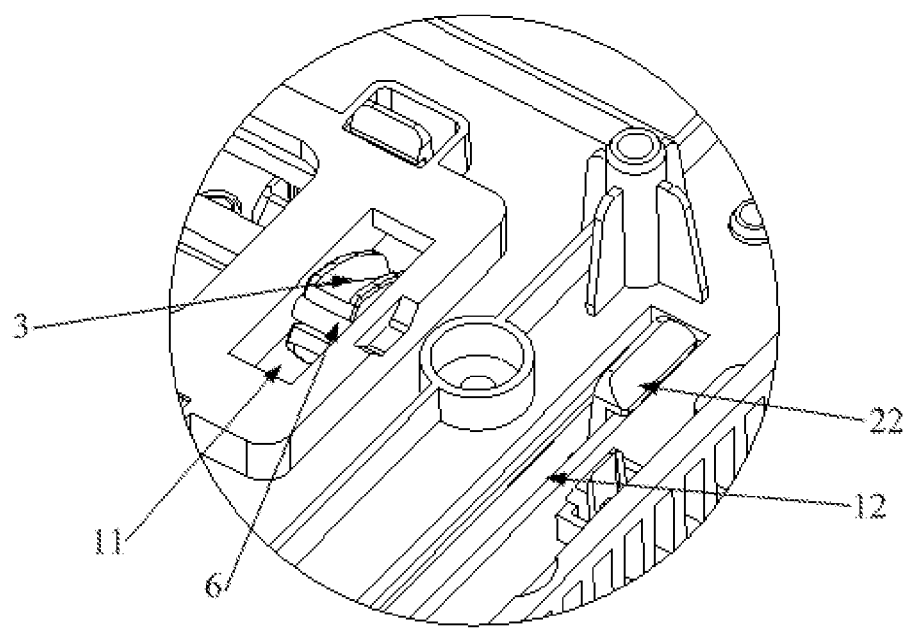
FIG. 5 illustrates the enlarged view of the structure in FIG. 3, C portion.

In order to further improve the above technical solutions, a rectangular opening 11 may be placed on the base 1, extending along the sliding direction of the sliding door 2. The moving block 3 may be placed inside the rectangular opening 11. As shown in FIG. 5, the guiding shaft 6 of base 1 is located inside the rectangular opening 11. When the moving block 3 rotates and slides relative to the guiding shaft 6, a part of the moving block 3 may always be inside the rectangular opening 11. Limited by the rectangular opening 11, the moving block 3 can only move along the plane of sliding direction of the sliding door 2, which prevents the moving block 3 from shaking in other directions, thereby, improve the smoothness of the sliding motion of sliding door 2. In some embodiments, instead of using the rectangular opening 11, connecting rod 5 may be used to limit the shaking of the moving block 3.

In some embodiments, the first movement mechanism group and the second movement mechanism group are located at the middle of the two opposite sides of the sliding door, respectively. For instance, when the sliding door 2 is rectangular, the first movement mechanism group shall be configured in the middle of a first short side, and the second movement mechanism group shall be configured in the middle of a second short side, which is opposite to the first short side. As such, when switching the sliding door 2 positions, that is, when opening and closing the sliding door 2, the sliding stroke of the sliding door 2 is short, which is convenient for operation. The above two movement mechanism groups can also be configured near the edge of the short sides of the sliding door 2, or in the middle of the long sides of the sliding door 2. The present disclosure does not limit to specific configurations.

Specifically, there are two sliding modules in this embodiment, which are respectively located at two ends of the sliding door 2. The sliding component includes a sliding groove 12 configured on the base 1, and a sliding buckle 22 configured on the sliding door 2. The sliding buckle 22 coordinates with the sliding groove 12 to slide, to realize the slide movement of the sliding door 2 relative to base 1. The sliding module can also include the combination of slide rail and the pulley, to obtain the same effect of the coordinately sliding. The present disclosure will not enumerate all possible examples.

Figure 3:
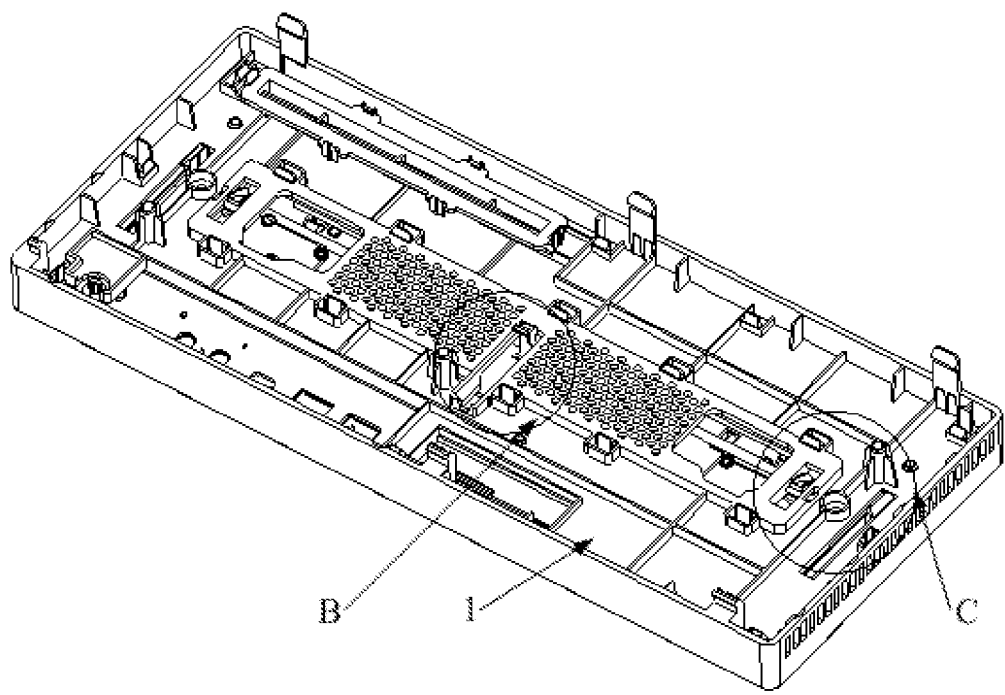
FIG. 3 illustrate the interior structure of the exemplary sliding door according to the embodiments of present disclosure.
Figure 4:
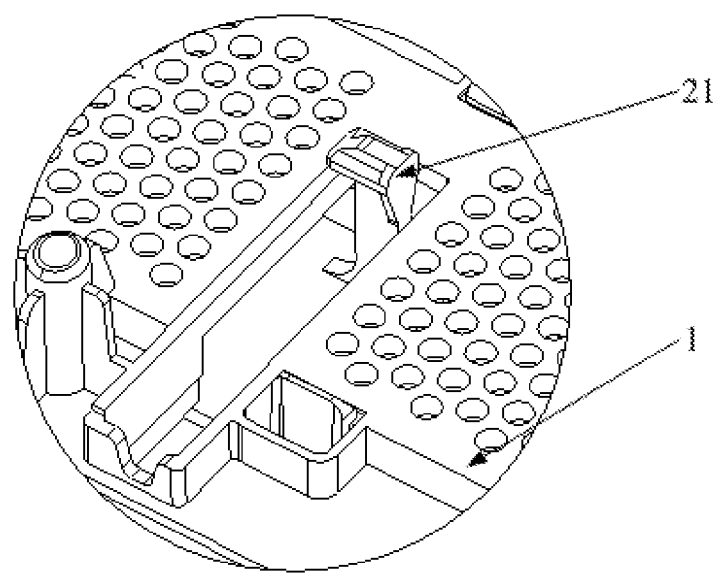
FIG. 4 illustrates the enlarged view of the structure in FIG. 3, B portion.

As shown in FIGS. 3, 4 and 6, the sliding door unit further includes a distance-limiting buckle 21, preventing the middle of the sliding door 2 from arching during sliding process. One end of the distance-limiting buckle 21 is fixed on the middle area of the sliding door, and the other end is hooked on base 1 and can slide. Specifically, the distance-limiting buckle 21 passes through a slot of the base 1 and is hooked on the surface of the base 1 away from the sliding door 2. During the sliding process of the sliding door 2, the distance-limiting buckle 21 slides along base 1, and limits the distance between the middle of the sliding door 2 and the base 1. This design on the one hand, prevents the middle of the sliding door 2 from arching during sliding process, and on the other hand it also obtains the effect of sliding the sliding door 2, while improving the smoothness of the sliding motion. In embodiments of the present disclosure, the above-mentioned distance-limiting buckle 21 may not be provided. The sliding door 2 still can obtain the effect of not deforming the middle part, by having a reduced size of the sliding door 2 or by some suitable processing technology.

In a specific embodiment, base 1 may be a front panel of a computer chassis. In some embodiments, the sliding door 2 shall be installed on the front panel of the computer chassis, thereby, the sliding door 2 is able to slide relatively to the front panel, so that part of the front panel structure such as the interfaces outlets/ports can be covered and revealed. Further, the above-mentioned base 1 can also be a cabinet frame, and the cabinet door can be opened and closed by sliding the sliding door 2. Moreover, base 1 can also be a charging dock, which may reveal and block the charging slots by sliding the sliding door 2. The charging dock can be dustproof and waterproof while not in use when covered by the sliding door 2. The above-mentioned base 1 may also be other structures as long as it can accommodate the sliding door 2. The details of various structures of base 1 are consistent with the embodiments described above, and will not be exhaustively describe herewith.

An embodiment of the present disclosure further provides an electronic device, including the sliding door unit, wherein such sliding door unit can be any one of the above-mentioned embodiments according to the sliding door unit. When the sliding door 2 slides, different interface ports of the electronic device can be blocked or revealed depending on the position of the sliding door 2. The details of various structures of the sliding door unit are consistent with the embodiments described above, and will not be exhaustively describe herewith.

In this embodiment, specifically, the electronic device is a desktop computer, and the sliding door unit is installed on the front panel of the computer chassis, to obtain the functionality of switching to either block the front I/O interface ports or to block the optical drive. Obviously, the above-mentioned electronic device may also be an all-in-one computer or a printer, an air conditioning unit, and so on. The sliding door unit can be installed at a structure where various ports and outlets need to be covered or revealed.

The embodiments in this specification are described in a progressive manner. Each embodiment focuses on its differences from the other embodiments. The same and similar parts between the embodiments can refer to each other.

The foregoing descriptions are merely specific implementations of the present disclosure, but are not intended to limit the protection scope of the present disclosure. Any variation or replacement readily derived by a person skilled in the art within the technical scope disclosed in the present disclosure shall fall within the protection scope of the present disclosure. Therefore, the present disclosure shall not be limited to the embodiments shown herein, but should conform to the widest scope consistent with the principles and the novelties disclosed herein.

What is claimed is:

1. A sliding door unit, comprising:
a sliding door, setting on a base through a sliding component, and configured to slide relative to the base when receiving an external force;
a first movement mechanism group placed at a first end of the sliding door;
a second movement mechanism group placed at a second end of the sliding door, and the first and second ends being two opposite ends; and
wherein the first movement mechanism group and the second movement mechanism group move at a matching pace relative to the sliding door on the base when the sliding door is moved by the external force and the first movement mechanism group and the second movement mechanism group are of an identical structure and are connected by a connecting rod perpendicular to the sliding direction of the sliding door on the base, and wherein the identical structure comprising a moving block configured to move in a plane perpendicular to the sliding door, a first end of the movement block being hinged to the sliding door, and a second end of the movement block being hinged to the base and being configured to slide with the base in coordination.

2. The sliding door according to claim 1, wherein the first end of the moving block hinges to the sliding door through a sliding shaft, and the second end of the moving block has a U-shaped connecting part with an opening facing the base, and a slidable guiding shaft is located inside a center groove of the U-shaped connecting part in the base.

3. The sliding door according to claim 1, wherein the first end of the connecting rod are fixedly connected to a center hole of the moving block of the first moving mechanism group, and the second end of the connecting rod is fixedly connected to the center hole of the moving block of the second moving mechanism group.

4. The sliding door according to claim 1, wherein a rectangular hole extending along the sliding direction of the sliding door is configured on the base, and the moving block is located in the rectangular hole.

5. The sliding door according to claim 1, wherein the first movement mechanism group and the second movement mechanism group are located at a middle position between two opposite sides of the sliding door.

6. The sliding door according to claim 1, further including a distance-limiting buckle preventing the middle of the sliding door from arching during a sliding motion, wherein one end of the buckle is fixed at a middle position of the sliding door, and the other end of the buckle is slidably hooked on the base.

7. The sliding door according to claim 1, wherein the base is a front panel of a computer chassis.

8. An electronic device, including a sliding door unit in front of a chassis with one or more electrical ports, when a sliding door of the sliding door unit slides, the one more electrical ports of the electronic device are revealed, the sliding door unit comprising:
a sliding door, setting on a base through a sliding component, and configured to slide relative to the base when receiving an external force;
a first movement mechanism group placed at a first end of the sliding door;
a second movement mechanism group placed at a second end of the sliding door, and the first and second ends being two opposite ends;
a distance-limiting buckle having one end of the buckle being fixed at a middle position of the sliding door and the other end of the buckle slidably hooked on the base, preventing the sliding door from deforming during a sliding motion; and
wherein the first movement mechanism group and the second movement mechanism group move at a matching pace relative to the sliding door on the base when the sliding door is moved by the external force.

9. The electronic device according to claim 8, wherein the first movement mechanism group and the second movement mechanism group are connected by a connecting rod, and the connecting rod is perpendicular to the sliding direction of the sliding door on the base.

10. The electronic device according to claim 9, wherein the first movement mechanism group and the second movement mechanism group are of an identical structure, and the structure comprising:
a moving block configured to move in a plane perpendicular to the sliding door, a first end of the movement block being hinged to the sliding door, and a second end of the movement block being hinged to the base and being configured to slide with the base in coordination.

11. The electronic device according to claim 10, wherein the first end of the moving block hinges to the sliding door through a sliding shaft, and the second end of the moving block has a U-shaped connecting part with an opening facing the base, and a slidable guiding shaft is located inside a center groove of the U-shaped connecting part in the base.

12. The electronic device according to claim 10, wherein the first end of the connecting rod are fixedly connected to a center hole of the moving block of the first moving mechanism group, and the second end of the connecting rod is fixedly connected to the center hole of the moving block of the second moving mechanism group.

13. The electronic device according to claim 10, wherein a rectangular hole extending along the sliding direction of the sliding door is configured on the base, and the moving block is located in the rectangular hole.

14. The electronic device according to claim 8, wherein the first movement mechanism group and the second movement mechanism group are located at a middle position between two opposite sides of the sliding door.

15. The electronic device according to claim 8, wherein the preventing the sliding door from deforming including preventing the middle section of the sliding door from arching.

16. The electronic device according to claim 8, wherein the base is a front panel of the chassis.

* * * * *